United States Patent
Sun (10) Patent No.: US 6,792,672 B1
(45) Date of Patent: Sep. 21, 2004

(54) HEAT SINK MANUFACTURING APPARATUS

(75) Inventor: Chung-Chuen Sun, Ping Zhen (TW)

(73) Assignee: Fan Zhen Co., Ltd., Taoyuan Hsien (TW)

( * ) Notice: Subject to any disclaimer, the term of this patent is extended or adjusted under 35 U.S.C. 154(b) by 0 days.

(21) Appl. No.: 10/449,229

(22) Filed: Jun. 2, 2003

(51) Int. Cl.[7] .................. B23P 15/26; B21D 53/06
(52) U.S. Cl. ............... 29/726; 29/557; 29/890.03; 29/890.05
(58) Field of Search .......... 29/726, 727, 557, 29/558, 890.03, 890.05, 559; 165/80.3, 185; 83/39, 870, 874; 72/254; 269/21, 25, 113, 112, 111, 107

(56) References Cited

U.S. PATENT DOCUMENTS

| | | | | |
|---|---|---|---|---|
| 3,791,003 A | * | 2/1974 | Pasternak | 29/890.048 |
| 3,825,117 A | * | 7/1974 | Krause | 269/217 |
| 4,330,913 A | * | 5/1982 | Kritzer | 72/325 |
| 4,332,069 A | * | 6/1982 | Kritzer | 72/325 |
| 4,696,096 A | * | 9/1987 | Green et al. | 29/829 |
| 4,987,765 A | * | 1/1991 | Nishimura et al. | 72/405.03 |
| 5,319,294 A | * | 6/1994 | Ohto et al. | 318/568.22 |
| 5,327,623 A | * | 7/1994 | Noel | 29/4 |
| 6,264,457 B1 | * | 7/2001 | Ohmes et al. | 425/145 |
| 6,339,880 B1 | * | 1/2002 | Ohta | 29/890.03 |
| 2002/0152858 A1 | * | 10/2002 | Tsai et al. | 83/17 |
| 2002/0189790 A1 | * | 12/2002 | Wong | 165/80.3 |

* cited by examiner

*Primary Examiner*—Marc Jimenez
(74) *Attorney, Agent, or Firm*—Dennison, Schultz, Dougherty & MacDonald (57) ABSTRACT

A heat sink apparatus includes a working machine having a power arm for driving a knife set forwards and backwards and has a follower axle with a cam having a sensor for sensing the rotation of the cam; a material feeding mechanism on the top surface thereof includes a clamping seat engaging a bolt in the material feeding mechanism. One end of the bolt connects to a motor. A microcomputer control device having an input end connected to the sensor receives a signal emitted from the sensor while the output end is connected with the controlling of the motor of the material feeding mechanism.

3 Claims, 6 Drawing Sheets

HEAT SINK MANUFACTURING APPARATUS

BACKGROUND OF THE INVENTION

1. Field of the Invention

The present invention is related to an improved heat sink manufacturing apparatus, and especially related to an improved heat sink manufacturing apparatus with which cutting distance can be adjusted to improve the performance of processing of the apparatus, thus, the production efficiency and easier assembling as well as convenient maintenance of the apparatus can be achieved, the apparatus suits for manufacturing a heat sink or the like.

2. Description of the Prior Art

By virtue of the highly developments of the science and technology as well as industries; the rate of inventing and using various electric appliances is raised relatively. To these electric appliances in maintaining normal operation, the problem of heat sinking is quite important; especially by fast developments of modem computers, working speeds of CPU's get faster day by day, and high temperature accordingly results, the need of heat sinks of high efficiency with fans for scattering heat is increased, otherwise, the CPU's will be burned.

The conventional heat sink is made by extruding of aluminum; the heat sink made by extruding of aluminum has fins with quite large thickness, and the space between every two fins is unable to be reduced. Thereby, the number of fins that can be formed in every unit area is limited, and an area to dissipate heat cannot be effectively increased. A single fin has limited heat-sinking effect; the only way to increase the area to dissipate heat is to make the heat sink relatively large, but this does not meet the requirement of the abovementioned CPU's of high speeds.

To solve the problem that the volume of a heat sink is large but the heat sinking effect of the heat sink is not good, a new fashioned heat sink has been made by using an automation CNC working machine. Such a working machine has a knife set fixed and has the fed material pushed forwards in sequence; the material is cut in a bevel way to get fins, the thickness of each cutting is very small, this can effectively improve the space between every two fins to largely reduce the volume of the heat sink; however, the working machine is very expensive and its manufacturing speed is slow, this is the primary flaw thereof.

Figure 1:
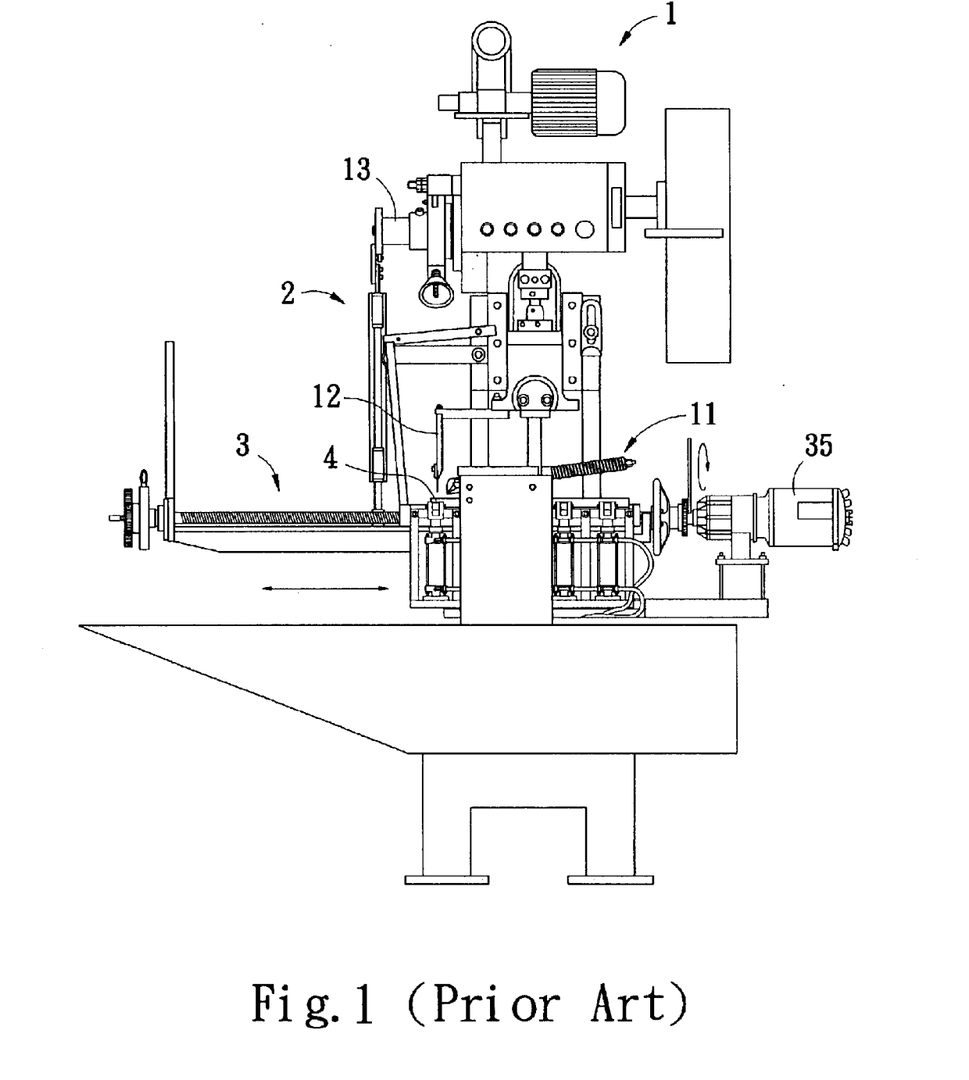
FIG. 1 is a plane view showing the appearance of the conventional heat sink manufacturing apparatus.
Figure 2:
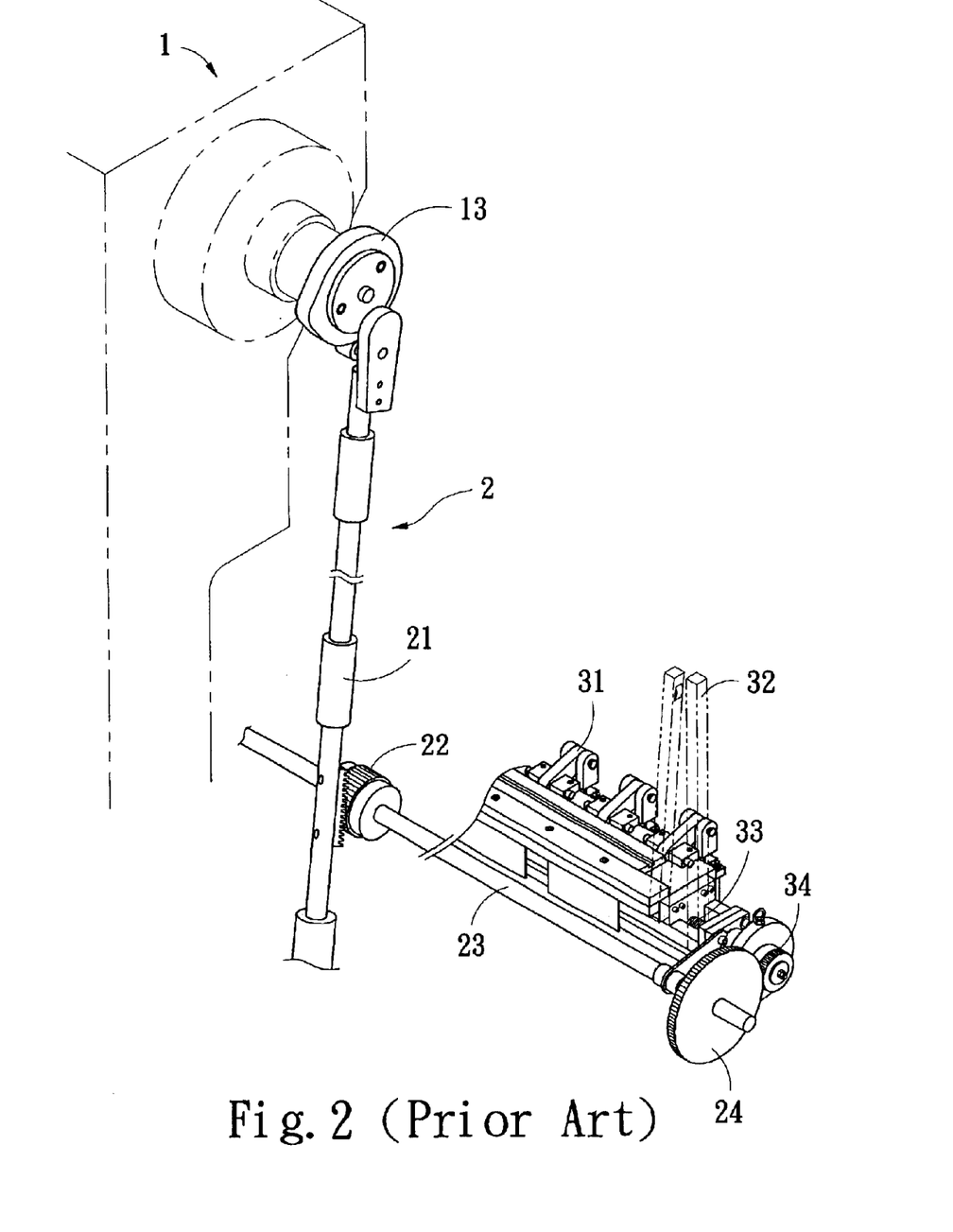
FIG. 2 is a perspective view showing a part of FIG. 1.

Referring to FIGS. 1 and 2, it is shown a heat sink manufacturing apparatus that the inventor of the present invention developed before with a U.S. patent application having a Ser. No. 10/229,142; the apparatus can perform cutting operation just by using a conventional working machine, it can not only great reduce the cost of the apparatus, but also has the rate of production evidently faster than those of a CNC working machine.

The manufacturing apparatus comprises of structurally: a working machine 1, a linkage equipment 2 and a material feeding mechanism 3; wherein the material feeding mechanism 3 is provided in the working area of the working machine 1, and a power arm is provided in the working area to drive a knife set 11. The power arm is provided laterally thereof with a fin fixing rod 12; the linkage equipment 12 includes a cam 13 on a follower axle of the working machine 1 to move a linked-up rod 21 which is provided on the bottom thereof with a linked-up gear 22, a rod 23 connected with the linked-up gear 22 connects and rotates a reducing gear 24; the feeding mechanism 3 is provided thereon with a clamping seat 31, the clamping seat 31 is provided on the end thereof with a contact switch 32 and is moved by an internal bolt 33 for moving forwards and retracting. The bolt 33 is provided on one end thereof with a transmission gear 34 engaged with the reducing gear 24 of the linkage equipment 2, and is provided on the other end thereof with a motor 35. By driving the elastically-extending and contracting knife set 11 by the power arm, the material 4 clamped on the feeding mechanism 3 can be cut in a bevel way, and the power arm synchronically links up the feeding mechanism 3 through the linkage equipment 2 to make the material 4 on the feeding mechanism 3 advance for a same distance each time. The process of cutting in a bevel way of the knife set 11 is repeatedly executed until the feeding mechanism 3 reaches an end and touches the switch 32 to stop motion. Thereby, cutting can be fast in production of heat sinks.

The above stated heat sink manufacturing apparatus surely can increase the speed of processing, however, it has some deficiencies to be improved:

1. The entire structural designing of the conventional heat sink manufacturing apparatus is related to material feeding, the cam, links, the gear, a dial etc. therein are linked up mutually, the distance of moving is fixed, thereby the fins to be processed only have between every two fins a fixed space which is unable to be adjusted at will.
2. By the mode of fixed assembling, all the parts shall be precise in arrangement and alignment, thereby manufacturing and assembling are uneasy, and maintenance takes more time; and all members of the parts are also fixedly allocated, if there is an error requiring for adjustment in the process of production, the machine shall be stopped for such adjustment.
3. The knife set is also fixedly mounted; the thickness of cutting can not be adjusted at any time.
4. The clamping seat for clamping the material is in the form of a claw, the members of it are a lot, however, the clamping points are still not enough, in case there is a slight error in relation to the specification of the material, after may times of cutting and being subject to raising and pressing forces on the apparatus, the material will be slightly deviated from the due angle of cutting.

In view of these, the inventor of the present invention studied and developed the improved heat sink manufacturing apparatus of the present invention to provide an adjustable cutting distance to improve the performance of processing of the apparatus and to increase the efficiency of production, and easier assembling as well as convenient maintenance of the apparatus can be achieved; manufacturers of the art can feel convenience in using, the industrial competition can be increased. And these are the motive of the present invention.

SUMMARY OF THE INVENTION

The primary object of the present invention is to provide an improved heat sink manufacturing apparatus able to improve the performance of processing of the apparatus and to increase the efficiency of production, make easier production and assembling.

To achieve the object, the improved heat sink manufacturing apparatus of the present invention comprises of: a working machine, the working machine has a power arm for driving a knife set advancing in a bevel way and moving forwards and retracting elastically, and has a follower axle with a cam having a sensor for sensing the rotation of the cam; a material feeding mechanism provided on the top surface thereof with a clamping seat engaging with a bolt in the feeding mechanism, one end of the bolt connects a motor; and a microcomputer control device of which the input end is connected with the sensor to receive the signals emitted from the sensor while the output end is connected with for controlling the motor of the material feeding mechanism. In this mode, the cutting distance can be adjusted to largely improve the performance of processing of the apparatus, and the production, assembling as well as maintenance and correction can be more convenient to thereby increase the efficiency of production.

The present invention will be apparent after reading the detailed description of the preferred embodiments thereof in reference to the accompanying drawings.

DETAILED DESCRIPTION OF THE PREFERRED EMBODIMENT

Figure 3:
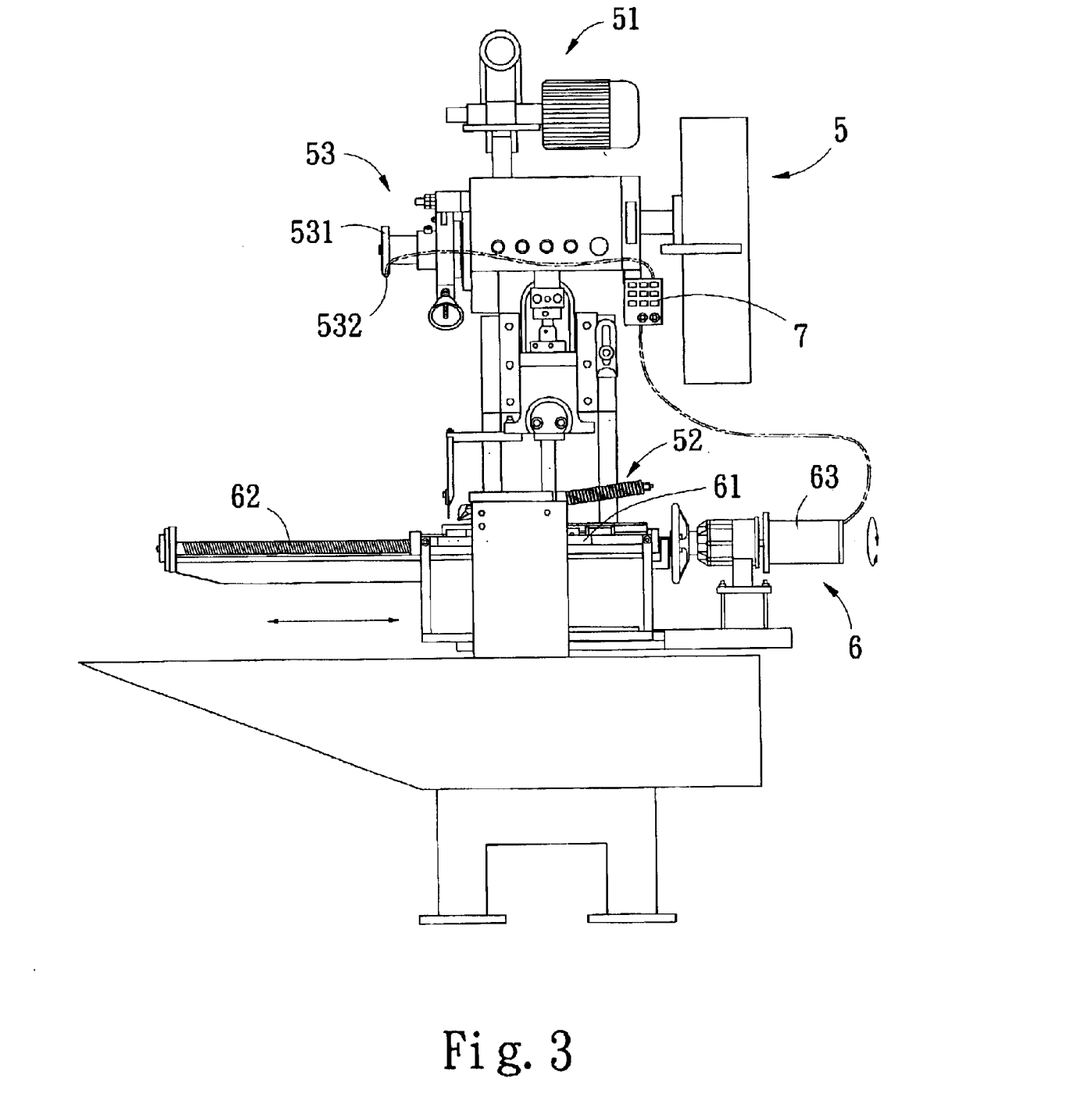
FIG. 3 is a plane view showing the appearance of the present invention.
Figure 4:
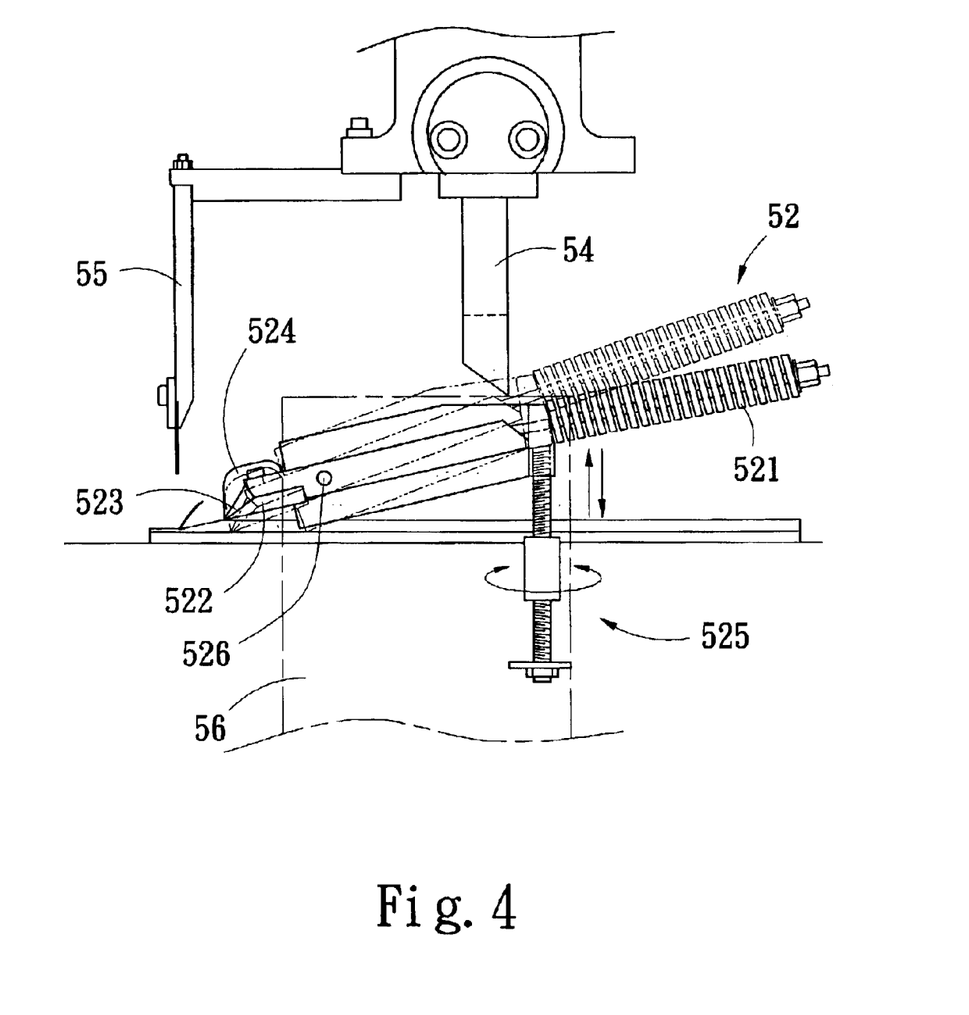
FIG. 4 is a schematic view showing the state of use of the knife set advancing in a bevel way of the present invention.

Referring to FIG. 3 showing an embodiment of an improved heat sink manufacturing apparatus of the present invention, it comprises of: a working machine 5, a material feeding mechanism 6 and a microcomputer control device 7.

Wherein the working machine 5 has a power arm 51 for driving a knife set 52 advancing in a bevel way and moving forwards and retracting elastically, and has a follower axle 53 with a cam 531, the working machine 5 has on the bottom thereof a punch 54 moving to and fro (as shown in FIG. 4), the punch 54 is inclined with the knife set 52 thereunder advancing in a bevel way and fixedly locked on a knife seat 56 and with a spring 521 thereon. One end of the knife set 52 advancing in a bevel way has a knife 522 of which the upper end of its front edge is provided at a suitable position with a recess 523 which forms at the joint thereof with the front edge an upper edge 524. The punch 54 of the power arm 51 is integrally provided at a suitable position on the periphery thereof with an "L" shaped positioning rod 55, the cam 531 is provided on the edge thereof with a sensor 532 to detect rotation of the cam 531.

The material feeding mechanism 6 is generally an elongate platform, and is provided on the top surface thereof with a clamping seat 61 engaging with a bolt 62 in the material feeding mechanism 6 (referring to FIG. 3), so that the clamping seat 61 can move to and fro on the bolt 62; one end of the bolt 62 connects a servo motor 63, rotating the servo motor 63 can move the bolt 62 to move forwards the clamping seat 61.

Figure 5:
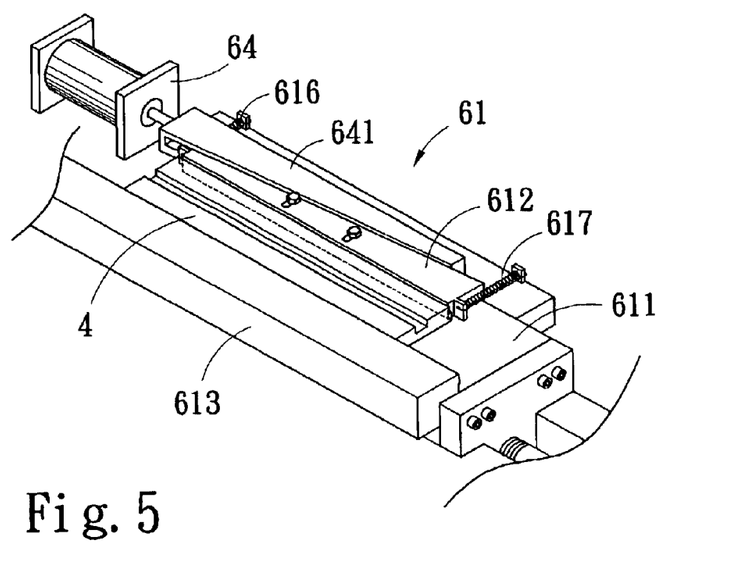
FIG. 5 is a perspective view showing the appearance of a clamping seat of the present invention.
Figure 6:
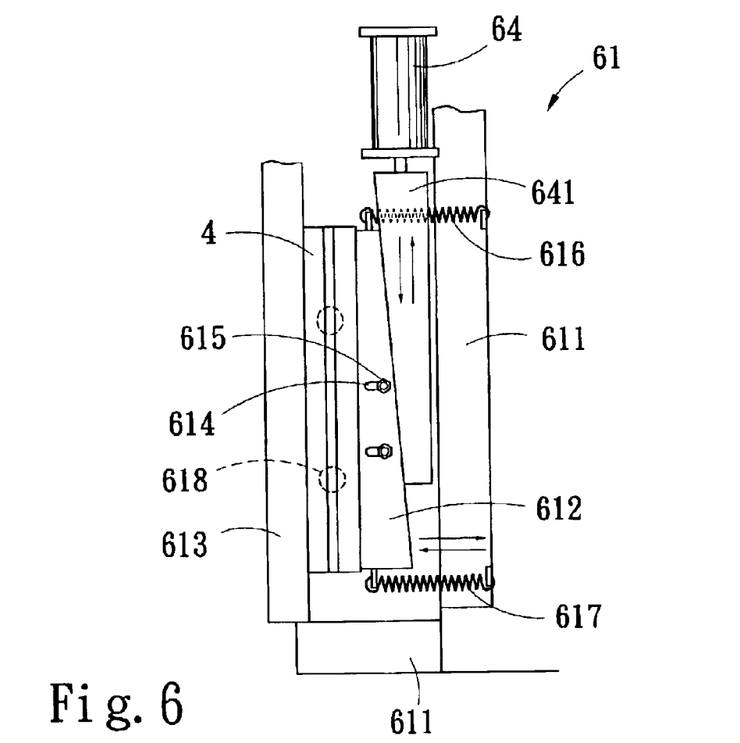
FIG. 6 is a top view from FIG. 5.

And as shown in FIGS. 5 and 6, the clamping seat 61 includes an "L" shaped base 611 in engagement with the bolt 62 and being provided with a movable clamping plate 612 and an air pressure cylinder 64 having on the front end thereof a pushing plate 641, one side of the base 611 is a raised fixed wall 613, the other side is for mounting the movable clamping plate 612 and the pushing plate 641 on the front end of the air pressure cylinder 64; the pushing plate 641 and the movable clamping plate 612 are wedges capable of wedging each other. The movable clamping plate 612 is provided on the middle section thereof with an elongate slot 614 for extending of a bolt 615 therethrough to be locked onto the base 611; the movable clamping plate 612 is further provided on the two ends thereof respectively with springs 616, 617. The pushing plate 641 on the front end of the air pressure cylinder 64 is inserted between the base 611 and the movable clamping plate 612; the movable clamping plate 612 can clamp tight and release a material 4 by pushing the air pressure cylinder 64 forwardly and rearwardly.

The microcomputer control device 7 is an NC digital controller or a programmable logic controller (PLC), the input end thereof is connected with the sensor 532 to receive the signals emitted from the sensor 532, while the output end thereof is connected with for controlling the motor 63 of the material feeding mechanism 6.

Thereby, the entire apparatus can be more convenient in manufacturing, assembling as well as maintenance and correction, thereby setting and changing such as of the speed of cutting and the cutting distance can be done on the NC digital controller (or the PLC); alternatively, it can be selected between the manual or the automatic operation modes. And for increasing the preciseness of cutting, the NC digital controller (or the PLC) can be used to control programmatically the mode of progressing of the motor (such as advancing two steps and retracting one step or advancing three steps and retracting one step each time) to reduce the accumulated allowable error thereof.

When in practice, referring to FIGS. 3–6, the material 4 is placed on the clamping seat 61 of the material feeding mechanism 6 in the first place, then the air pressure cylinder 64 is forwarded, the pushing plate 641 on the front end of the air pressure cylinder 64 wedges the movable clamping plate 612 on the clamping seat 61, the whole material 4 is firmly clamped between the raised fixed wall 613 of the "L" shaped base 611 and the movable clamping plate 612 in the clamping seat 61, and the clamping seat 61 (together with the material 4) is slid by the servo motor 63 to the starting position (under the knife 522), input is done on the microcomputer control device 7 (namely, the NC digital controller) to set the moving distance during processing and the last length to be processed etc., then the punch 54 on the bottom of the working machine 5 starts to process.

When the punch 54 with a bevel end rushes down onto the knife set 52, the knife 522 on the front end of the knife set 52 thereby cuts the surface of the material 4 in a bevel way; when the punch 54 retrieves to its raised position and the force of pressing down disappears, the spring 521 provided for the knife 522 rebound to retrieve the knife 522 to its original position. When the punch 54 has done a stroke, correspondingly, the cam 531 has rotated for a circle, while the sensor 532 provided on the cam 531 will send a signal of rotating of the cam 531 detected to the NC digital controller 7 (or the PLC), and the NC digital controller 7 (or the PLC) will control the servo motor 63 to rotate according to an instruction after receiving of the signal, and the bolt 62 connected in the servo motor 63 on the material feeding mechanism 6 is rotated, rotation of the bolt 62 moves forwards the clamping seat 61 for a distance; so that when the punch 54 of the working machine 5 rushes down again, the knife 522 once more cut the material 4 in a bevel way. The fin cut the last time is abutted against by the upper edge 524 of the knife 522, and is tossed over to the area where the positioning rod 55 is to make the fin be folded upwardly, the action is repeated again and again, until the surface of the material 4 is completely cut with the knife 522 in a bevel way into a lot of fins, the fins are abutted and positioned by the positioning rod 55 and the upper edge 524 of the knife 522. The operations of feeding, cutting, pushing to an upright state and retracting the knife can be completed in a single stroke of the punch. When the fins are cut one by one till the end having been set in the NC digital controller 7 (or the PLC), the improved heat sink manufacturing apparatus stop operating, now the cylinder 64 can be driven to retract the pushing plate 641 on the front end thereof, the springs 616, 617 provided on the two ends of the movable clamping plate 612 bring the movable clamping plate 612 back to its original position to allow releasing and removing of the material 4.

For the purpose of rendering the material 4 more firmly clamped on the clamping seat 61 during processing, the "L" shaped base 611 of the clamping seat 61 can be added with a plurality of vacuum suction disks 618 (as shown in FIG. 6), thereby after the material 4 is placed and clamped, it is more stable by enhancing suction of the vacuum suction disks 618 to help more precise cutting; additionally, in order that the thickness of cutting can be controlled at will, the present invention is provided on the rear end of the knife 522 of the knife set 52 advancing in a bevel way with a pivot axle 526 axially connecting with the knife seat 56; the middle section of the knife set 52 advancing in a bevel way is provided by connecting with a raising/lowering adjustment rod 525 (as shown in FIG. 4), thereby the height of the knife set 52 can be adjusted, so that the cutting angle can be changed in pursuance of the requirement of cutting thickness.

Figure 7:
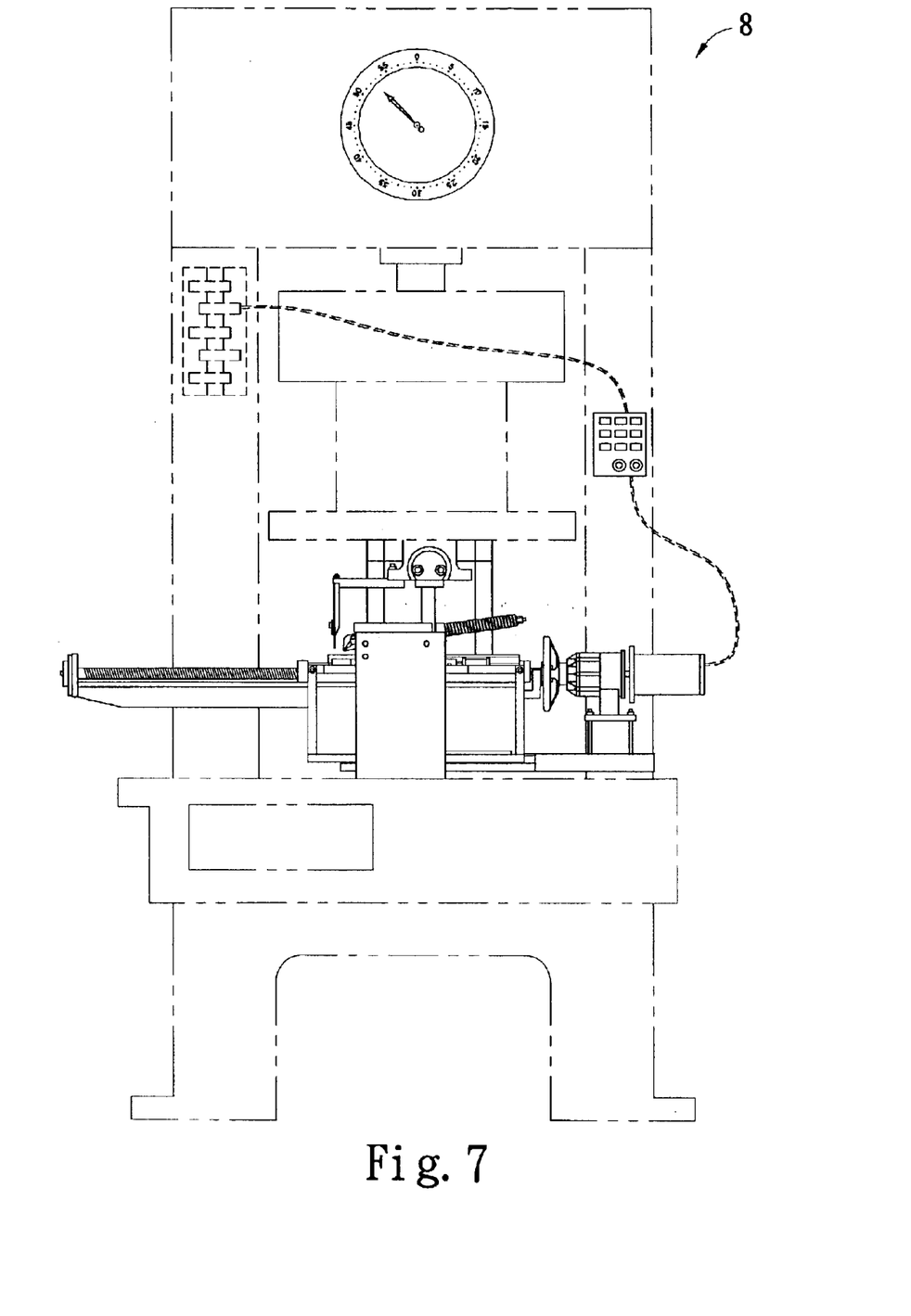
FIG. 7 is a schematic view showing application of the present invention on an air-pressure punching machine.

In view of the above statement, the present invention holds the following advantages:

1. The present invention uses a microcomputer control device and a sensor to control the entire manufacturing apparatus, and can complete the sequential actions of material feeding, rushing down, cut in a bevel way, abutting and knife retracting within a single stroke, they are different from the mechanical actions of the conventional apparatus only having a fixed moving distance, and it can increase the speed of production of the heat sink in a more economic and effective way.
2. The heat sink manufacturing apparatus of the present invention is structurally simpler than that of the conventional one, this makes production, assembling as well as maintenance and correction thereof more convenient, renders the linking devices etc. used originally reduced; and it can be controlled by the microcomputer control device and the sensor, so that allocation of parts thereof can no more be at fixed positions, and various styles of punching machines can be derived thereby to cut materials (such as an air-pressure punching machine 8 as shown in FIG. 7), and no more is limited to a single style of machine.
3. The present invention is provided on the air pressure cylinder thereof with a pushing plate, it is a wedge similar to a movable clamping plate capable of wedging each other; and a clamping seat is added with a plurality of vacuum suction disks to render the material to be more firmly clamped on the clamping seat by wedging of the pushing plate on the movable clamping plate and by suction of the vacuum suction disks, thereby the apparatus will not shake in operation to make error of preciseness during cutting, this can reduce the flaws of products.
4. The present invention can allow the times of cutting, the thickness of cutting or the distance between fins to be adjusted and set at will in pursuance of the requirements; if there are errors during processing, the apparatus can be adjusted immediately, thereby the practicability as well as competitiveness of the present invention can be largely increased.

In conclusion, the present invention can get the expected objects thereof to provide an improved heat sink manufacturing apparatus that can provide an adjustable cutting distance to improve the performance of processing of the apparatus, to reduce the cost of production and to increase the efficiency of production, effect production and easier assembling as well as convenient maintenance of the apparatus can be achieved; the present invention thereby has extremely industrial value.

Having thus described my invention, what I claim as new and desire to be secured by Letters Patent of the United States are:

1. An improved heat sink manufacturing apparatus comprising:

a working machine having a power arm for driving a knife set advancing in a bevel way and moving forwards and retracting elastically, and having a follower axle with a cam having a sensor for sensing rotation of said cam;

a material feeding mechanism provided on a top surface thereof with a clamping seat for clamping a material and engaging with a bolt in said material feeding mechanism, one end of said bolt connects a motor, said bolt is moved to forward said clamping seat when said motor rotates; and a microcomputer control device of which an input end is connected with said sensor to receive signals emitted from said sensor while an output end is connected with for controlling said motor of said material feeding mechanism, in this mode, cutting distance is allowed for adjustment to largely improve performance of processing of said apparatus, and wherein: said knife set advancing in a bevel way is fixedly locked on a knife seat, a front end of said knife set has a knife which is provided with a recess on the upper end of a front edge thereof, said recess forms at the joint thereof with said front edge an upper edge; said knife is provided on the rear end thereof with a pivot axle axially connecting with said knife seat; said knife set has on the end thereof a spring, and a middle section of said knife set advancing in a bevel way is provided by connecting with a raising/lowering adjustment rod, thereby height of said knife set is adapted to being changed.

2. The improved heat sink manufacturing apparatus as in claim 1 wherein: said clamping seat includes an "L" shaped base provided with a movable clamping plate and an air pressure cylinder having on a front end thereof a pushing plate, one said base is a raised fixed wall, said movable clamping plate and said pushing plate on said front end of said pressure cylinder are wedges capable of wedging each other, said movable clamping plate is provided on a middle section thereof with an elongate slot for extending of a bolt therethrough to be locked onto said base; said movable clamping plate is further provided on two ends thereof respectively with springs fixedly locked on said base, said pushing plate on the front end of said air pressure cylinder is inserted between said base and said movable clamping plate; said movable clamping plate is adapted to clamping tight and releasing said material by pushing said air pressure cylinder forwardly and rearwardly.

3. The improved heat sink manufacturing as in claim 2 wherein: said base is provided with a plurality of vacuum suction disks to suck said material.

* * * * *